(12) United States Patent
Miyazaki

(10) Patent No.: US 7,724,062 B2
(45) Date of Patent: May 25, 2010

(54) OUTPUT BUFFER CIRCUIT

(75) Inventor: Hiroshi Miyazaki, Kasugai (JP)

(73) Assignee: Fujitsu Microelectronics Limited, Yokohama (JP)

( * ) Notice: Subject to any disclaimer, the term of this patent is extended or adjusted under 35 U.S.C. 154(b) by 75 days.

(21) Appl. No.: 11/878,353

(22) Filed: Jul. 24, 2007

(65) Prior Publication Data

US 2008/0024189 A1 Jan. 31, 2008

(30) Foreign Application Priority Data

Jul. 31, 2006 (JP) .............................. P2006-208602

(51) Int. Cl.
*H03L 5/00* (2006.01)
(52) U.S. Cl. ........................................ 327/333; 363/86
(58) Field of Classification Search .................. 327/333; 326/56, 57, 58, 86
See application file for complete search history.

(56) References Cited

U.S. PATENT DOCUMENTS

| | | | | |
|---|---|---|---|---|
| 4,622,482 A | * | 11/1986 | Ganger | 327/410 |
| 6,181,542 B1 | * | 1/2001 | Liang et al. | 361/111 |
| 6,278,294 B1 | * | 8/2001 | Taniguchi | 326/80 |
| 7,420,395 B2 | * | 9/2008 | Kuramasu | 326/83 |
| 7,468,615 B1 | * | 12/2008 | Tan et al. | 326/68 |
| 2003/0080780 A1 | * | 5/2003 | Okamoto et al. | 326/83 |
| 2007/0262806 A1 | * | 11/2007 | Thummalapally et al. | 327/333 |

FOREIGN PATENT DOCUMENTS

| | | |
|---|---|---|
| JP | 09-232930 | 9/1997 |
| JP | 10-285013 A | 10/1998 |

* cited by examiner

*Primary Examiner*—Lincoln Donovan
*Assistant Examiner*—Thomas J Hiltunen

(57) ABSTRACT

An output buffer circuit that suppresses the generation of an erroneous operation signal during power activation includes a first level converter generating a first signal based on a data input signal having an amplitude range between a first power supply potential and a ground reference potential. The first signal has an amplitude range between a second power supply potential, which differs from the first power supply potential, and the ground reference potential. A second level converter generates a second signal having an amplitude range between the second power supply and ground reference potentials based on a control input signal having an amplitude range between the first power supply and ground reference potentials. The first signal falls with a delay from the second signal. An output circuit generates an output signal. A timing adjustment circuit compensates for the fall delay of the first signal during power activation.

5 Claims, 11 Drawing Sheets

US 7,724,062 B2

OUTPUT BUFFER CIRCUIT

CROSS-REFERENCE TO RELATED APPLICATIONS

This application is based upon and claims the benefit of priority from Japanese Patent Application No. 2006-208602, filed on Jul. 31, 2006, the entire contents of which are incorporated herein by reference.

BACKGROUND OF THE INVENTION

It is related to an output buffer circuit for a semiconductor device, and more particularly, to a three-state output buffer circuit.

Recent semiconductor devices have been configured so that internal circuits handle signals with lower levels than signals handled by external circuits to reduce power consumption. That is, the operation power supply voltage of the internal circuits is set lower at a level that is lower than that outside the semiconductor device. Therefore, the semiconductor device includes an output buffer circuit having a level converter that converts the signal level of the internal circuits to the external signal level.

A conventional output buffer circuit 100 for a semiconductor device that operates with two types of power supply voltage is described below with reference to FIG. 1.

The output buffer circuit 100 is a three-state type output buffer. The output buffer circuit 100 receives data input signal A and control input signal C from internal circuits (not shown in the drawing) of the semiconductor device and generates an output signal having one of three values, that is, an H level, an L level, or high impedance, based on the input signals A and C.

The output buffer circuit 100 includes a level converter unit 110, which converts the signal levels of the input signals A and C to a predetermined level to generate an intermediate signal, and an output circuit 130, which provides an external output terminal EX with an output signal OUT based on the intermediate signal generated by the level converter unit 110.

The level converter unit 110 includes a first level converter 110a and a second level converter 110b. The first level converter 110a receives the data input signal A from a core circuit that is operated by a power supply potential VDL of a semiconductor chip core. The first level converter 110a further receives an inversion signal A bar of the data input signal A. One of the signals A and A bar has a ground level (L level), and the other one of the signals A and A bar has the power supply potential VDL level (H level) of the semiconductor chip core. The first level converter 110a performs level conversion of the signals A and A bar having amplitudes from the ground level to the power supply potential VDL level of the semiconductor chip core to generate an intermediate signal B that has an amplitude from ground level to the power supply potential VDH level of an external output interface. Then, the first level converter 110a provides the intermediate signal B to the output circuit 130.

Specifically, when the data input signal A is set at an H level and the inversion signal A bar is set at an L level, a transistor TN11 is turned OFF and a transistor TN12 is turned ON. When the transistor TN12 is turned ON, the gate of transistor TP11 is connected to ground. This turns ON the transistor TP11. When the transistor TP11 is turned ON, the gate of a transistor TP12 is connected to the power supply potential of an external output interface. This turns OFF the transistor TP12. In this state, the potential at a node N11 between the transistors TN11 and TP11 is set to an H level power supply potential (VDH) of the external output interface, and an intermediate signal B having the H level power supply potential of the external output interface is provided from the node N11 to the output circuit 130.

Conversely, when the data input signal A is set at an L level and the inversion signal A bar is set at an H level, the transistor TN11 is turned ON and the transistor TN12 is turned OFF. When the transistor TN11 is turned ON, the gate of the transistor TP12 is connected to ground. This turns On the transistor TP12. When the transistor TP12 is turned ON, the gate of the transistor TP11 is connected to the power supply potential VDH of the external output interface. This turns OFF the transistor TP11. In this state, the potential of the node N11 is set at the ground level, and an intermediate signal B having the ground level (L level) is provided from the node N11 to the output circuit 130.

Similarly, the second level converter 110b receives a control input signal C and an inversion signal C bar from internal circuits. The second level converter 110b performs level conversion of the signals C and C bar that have amplitudes from ground level to power supply potential VDL level of the semiconductor chip core to generate an intermediate signal D that has an amplitude from ground level to the power supply potential VDH level of the external output interface. Then, the second level converter 110b provides the intermediate signal D to the output circuit 130.

The output circuit 130 includes a logic control circuit 140 and a final stage buffer 150. Based on the intermediate signals B and D received from the level converter unit 110, the logic control circuit 140 generates signals E and F having either the ground level or the power supply potential VDH level of the external output interface at the transistors TP50 and TN50 of the final stage buffer 150.

Specifically, when the intermediate signal D has a power supply potential VDH level of the external output interface (the control input signal C has a power supply potential VDL level of the semiconductor chip core), an H level (power supply potential VDH level of the external output interface) signal E is provided to the transistor TP50 and an L level (ground level) signal F is provided to the transistor TN50 regardless of whether the intermediate signal B has an H level or an L level. In this state, a node N50 between the transistors TP50 and TN50 is set at high impedance because both of the transistors TP50 and TN50 are turned OFF.

When the intermediate signal D has the ground level (the control input signal C has the ground level) and the intermediate signal B has the power supply potential VDH level of the external output interface (the data input signal A has the power supply potential VDL level of the semiconductor chip core), L level signals E and F are provided to the transistors TP50 and TN50. Since the transistor TP50 is turned ON and the transistor TN50 is turned OFF in this state, an output signal OUT that has a power supply potential VDH level (H level) of the external output interface is provided to an external output terminal EX.

Furthermore, when the intermediate signals D and B have the ground level (the data input signals A and C have the ground level), H level signals E and F are provided to the transistors TP50 and TN50. Since the transistor TP50 is turned OFF and the transistor TN50 is turned ON at this time, a ground level (L level) output signal OUT is provided from the node N50 to the external output terminal EX.

Japanese Laid-Open Patent Publication No. 10-285013 describes such a three-state type output buffer circuit.

In such an output buffer circuit 100, when the level converters 110a and 110b have different internal parasitic capacities, a signal delay skew occurs during power activation between the intermediate signal B generated by the first level converter 110a and the intermediate signal D generated by the second level converter 110b (refer to FIG. 2(b)). In particular, the intermediate signal B is delayed from the intermediate signal D when the parasitic capacitance of the first level converter 110a is greater than the parasitic capacitance of the second level converter 110b. The magnitude of the parasitic capacitance changes depending on the type of power supply wiring in an upper layer and the length of the wiring, which changes in accordance with the layout position of the elements such as transistors in the level converters 110a and 110b. The inventor of the present invention has found that such a signal delay skew generates an erroneous operation signal SH as shown in FIG. 2(d) as an output signal OUT.

A case in which an erroneous operation signal SH is generated when the level converter unit 110 receives an L level data input signal A and an L level control input signal C during power activation will now be discussed.

As shown in FIG. 2(a), during power activation, the power supply potential VDL of the semiconductor chip core and the power supply potential VDH of the external output interface each rise with a predetermined slope. Furthermore, the H level inversion signals A bar and C bar follow the rising level of the power supply potential VDL of the semiconductor chip core and also rise. In this state, the signal levels of the intermediate signals B and D generated by the level converters 110a and 110b follow the rising of the external output interface power supply potential VDH until the signal levels of the inversion signals A bar and C bar exceed the threshold voltages of the respective transistors TN11 and TN21, as shown in FIG. 2(b). Then, when the inversion signals A bar and C bar exceed the thresholds of the transistors TN11 and TN21, the transistors TN11 and TN21 are turned ON, and the intermediate signals B and D fall to the ground level (L level). However, the fall of the intermediate signal B is delayed relative to the intermediate signal D when the parasitic capacitance of the first level converter 110a is greater than the parasitic capacitance of the second level converter 110b, as previously described. The signal delay skew generated by the intermediate signals B and D is maintained by a racing in the buffer, and is also generated in the transistors TP50 and TN50 of the final stage buffer 150. That is, as shown in FIG. 2(c), a period occurs in which both the signals E and F that are provided to the transistors TP50 and TN50 are set at L level. Thus, since the P-channel MOS transistor TP50 is turned ON and the N-channel MOS transistor TN50 is turned OFF, and H level erroneous operation signal SH is momentarily generated as an output signal OUT, which follows the rising level of the external output interface power supply potential VDH, as shown in FIG. 2(d). Accordingly, there is a possibility that this erroneous operation signal SH may cause an erroneous operation during power activation.

SUMMARY OF THE INVENTION

An output buffer circuit that suppresses the generation of an erroneous operation signal during power activation is provided.

One aspect is an output buffer circuit including a first level converter for generating a first signal based on a data input signal having an amplitude range between a first power supply potential and a ground reference potential. The first signal has an amplitude range between a second power supply potential, which differs from the first power supply potential, and the ground reference potential. A second level converter generates a second signal having an amplitude range between the second power supply potential and the ground reference potential based on a control input signal having an amplitude range between the first power supply potential and the ground reference potential. The first signal falls with a delay from the second signal. An output circuit generates an output signal having one of three values of the ground reference potential, second power supply potential, and high impedance based on the first signal and second signal. A timing adjustment circuit compensates for the fall delay of the first signal from the second signal during power activation.

Other aspects and advantages will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

First Embodiment

An output buffer circuit 1 according to a first embodiment of the present invention will now be discussed with reference to FIGS. 3 through 5.

Figure 1:
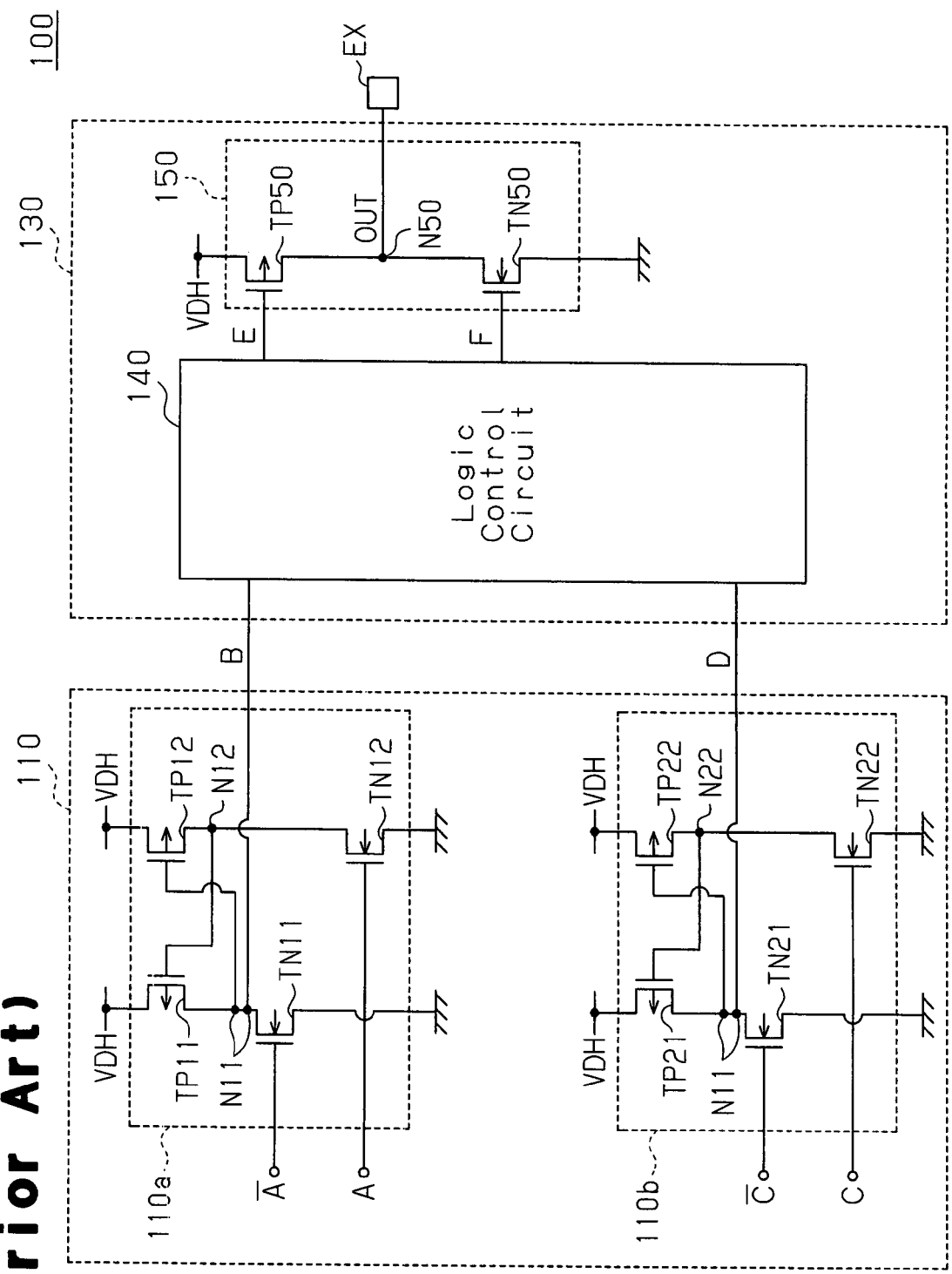
FIG. 1 is a circuit diagram of a conventional output buffer circuit.
Figure 2A:
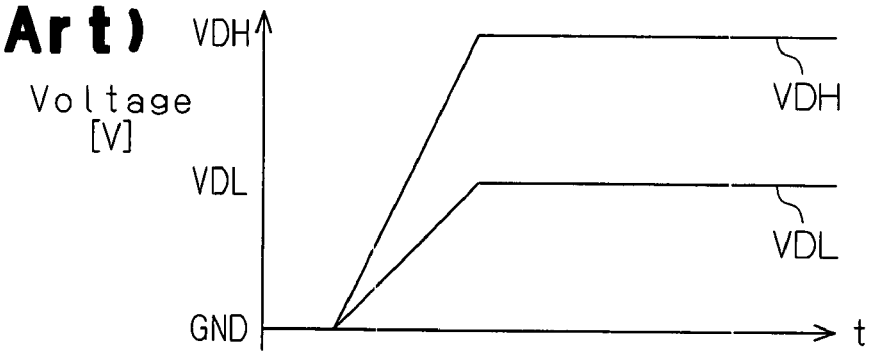
FIGS. 2(a) through 2(d) are waveform diagrams showing operations performed during power activation in the related art.
Figure 2B:
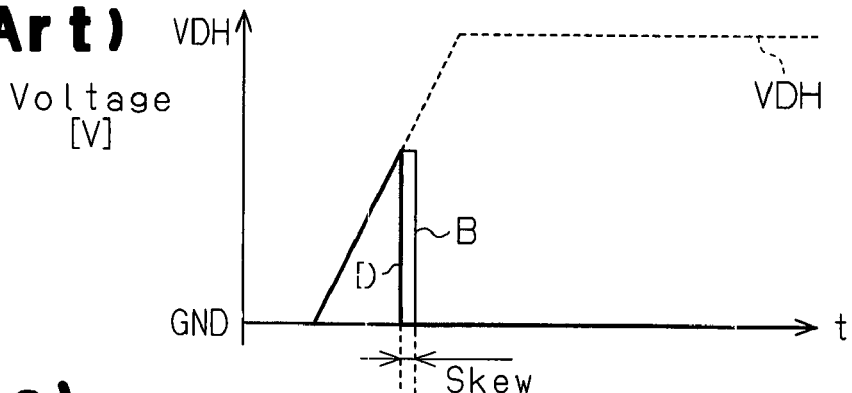
Figure 2C:
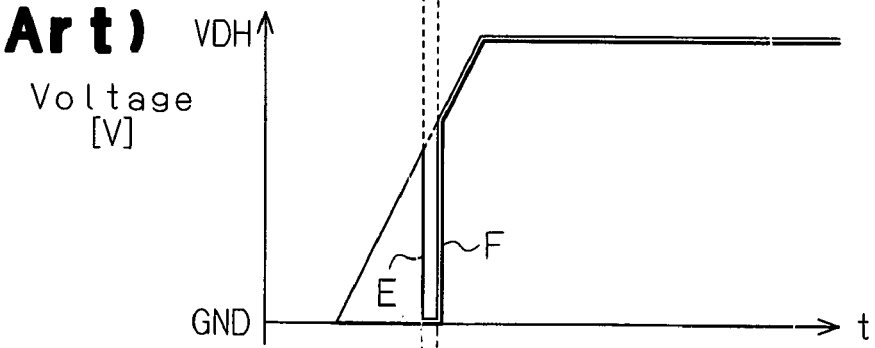
Figure 2D:
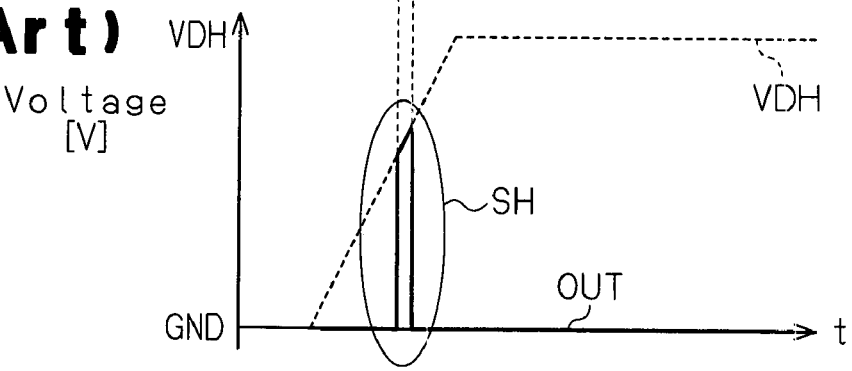
Figure 3:
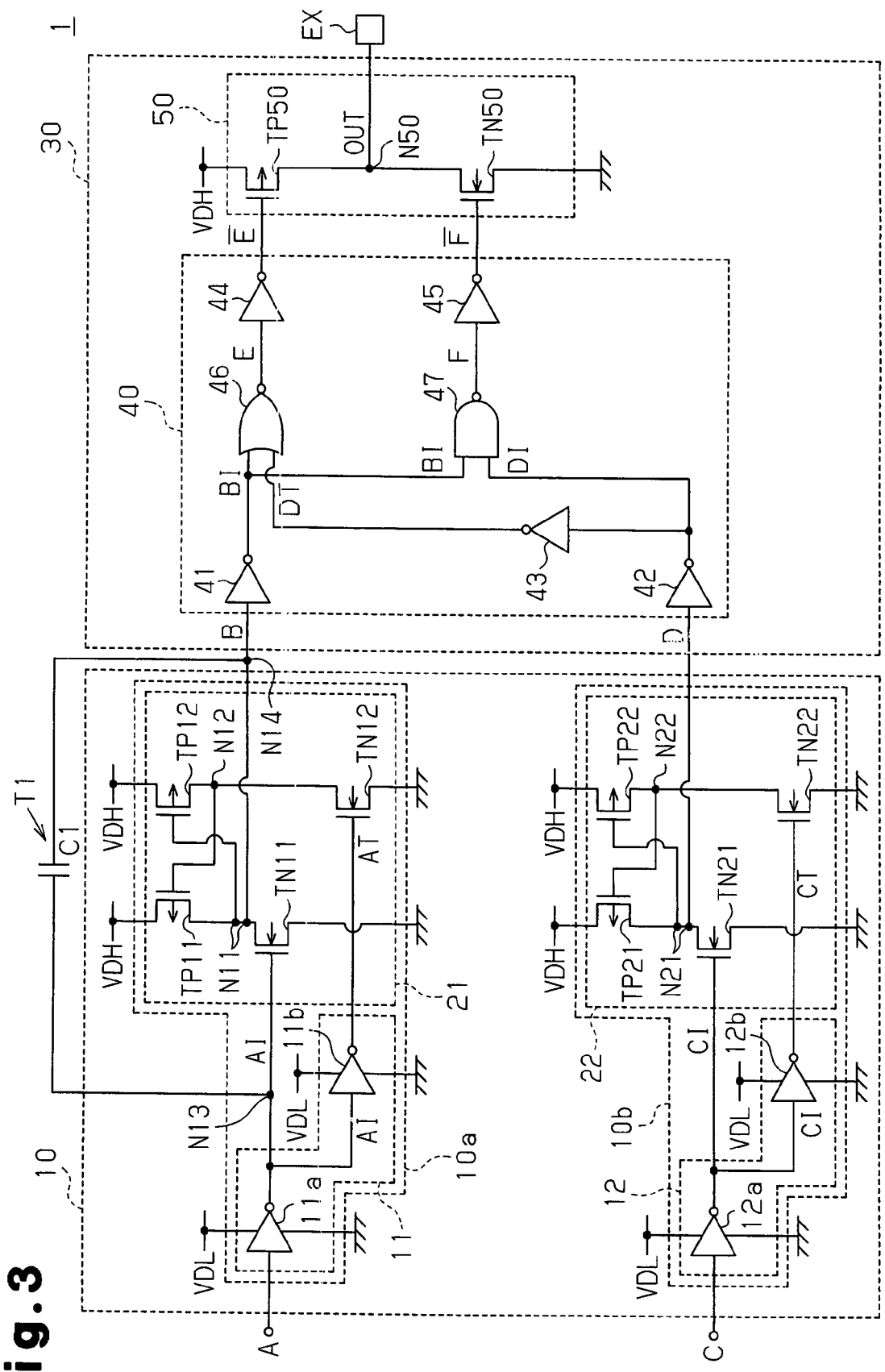
FIG. 3 is a schematic circuit diagram showing an output buffer circuit according to a first embodiment.
Figure 4:
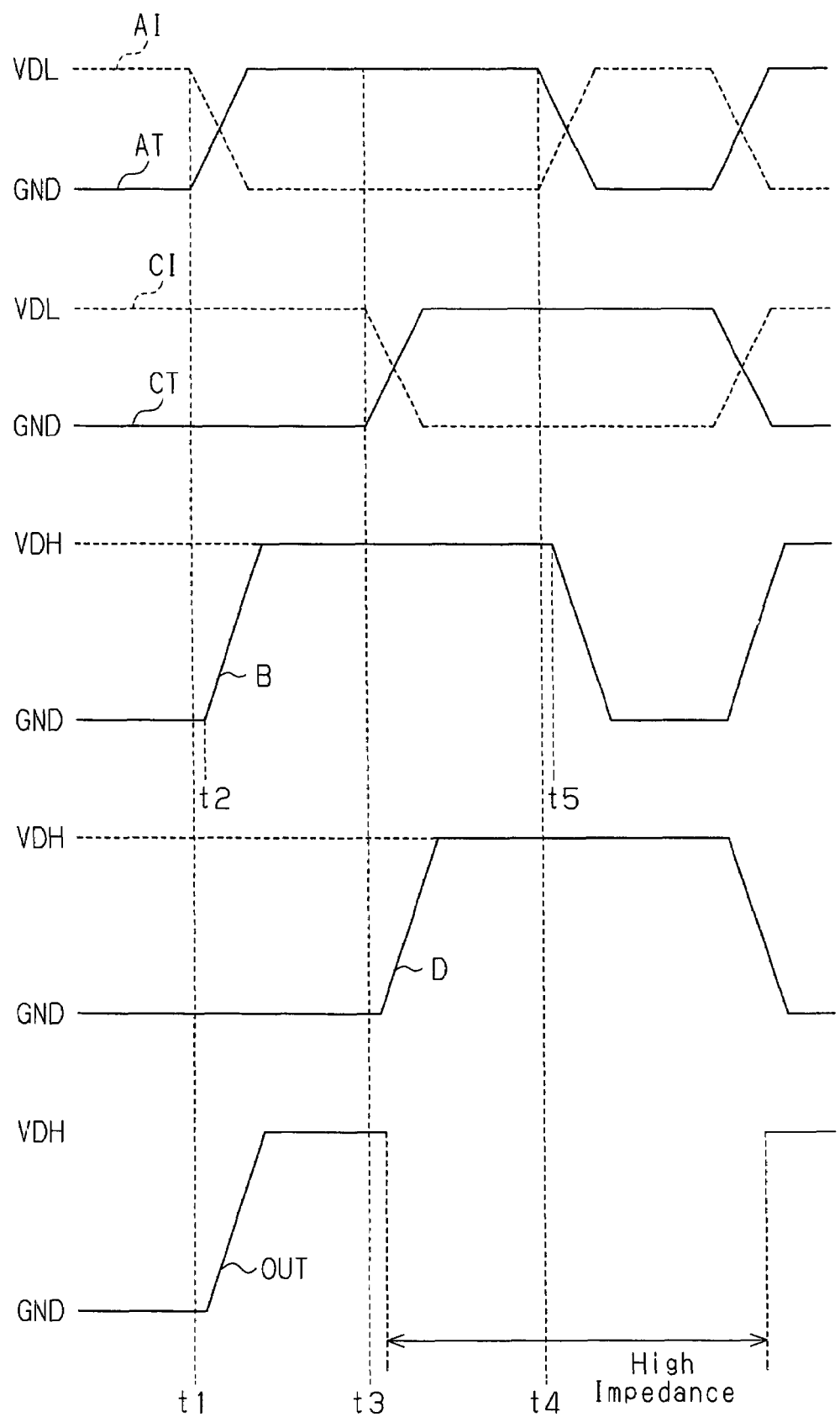
FIG. 4 is a waveform diagram showing operations when the power level is stable in the first embodiment.

As shown in FIG. 3, the output buffer circuit 1, which includes a level converter unit 10 for converting the signal levels of input signals provided from internal circuits of the semiconductor device (not shown) to generate intermediate signals, and an output circuit 30, which provides an output signal OUT to an external output terminal EX based on the intermediate signals received from the level converter unit 10, and a timing adjustment circuit T1.

The level converter unit 10 includes a first level converter 10a and a second level converter 10b. The first level converter 10a performs level conversion on a data input signal A received from an internal circuit to generate an intermediate signal, which is then provided to the output circuit 30. The second level converter 10b performs level conversion on the control input signal C received from an internal circuit to generate an intermediate signal, which is then provided to the output circuit 30.

The first level converter 10a includes a first input circuit 11 and a first level converter circuit 21. The first input circuit 11 includes first and second inverter circuits 11a and 11b. The inverter circuits 11a and 11b each have two power supply terminals respectively connected to a power supply potential VDL of a semiconductor chip core and a ground reference potential. The first inverter circuit 11a receives the data input signal A and logically inverts the data input signal A to generate a signal AI having either a power supply potential VDL level of the semiconductor chip core (H level) or a ground level (L level). The second inverter circuit 11b receives the signal AI from the first inverter circuit 11a and logically inverts the signal AI to generate a signal AT having either a power supply potential VDL level of the semiconductor chip core (H level) or a ground level (L level). Therefore, the first input circuit 11 generates complementary signals AT and AI that have amplitudes from ground level to the power supply potential VDL level of the semiconductor chip core.

The first level converter circuit 21 receives the signal AI and signal AT. The signal AI generated by the first inverter circuit 11a is provided to the gate of an N-channel MOS transistor TN11, and the signal AT generated by the second inverter circuit 11b is provided to the gate of an N-channel MOS transistor TN12. The sources of both transistors TN11 and TN12 are connected to ground.

The drain of the transistor TN11 is connected to the drain of a P-channel MOS transistor TP11, and the drain of the transistor TN12 is connected to the drain of a P-channel MOS transistor TP12. The sources of both P-channel MOS transistors TP11 and TP12 are connected to an external output interface power supply potential VDH.

A node N11 between the transistors TN11 and TP11 is connected to the gate of the transistor TP12, and a node N12 between the transistors TN12 and TP12 is connected to the gate of the transistor TP11. Furthermore, the node N11 is connected to the output circuit 30, and an intermediate signal B that has either a ground level (L level) or an external output interface power supply potential VDH level (H level) is provided from the node N11 to the output circuit 30. That is, the first level converter circuit 21 performs level conversion of the complementary signals AT and AI that have amplitudes from ground level to the power supply potential VDL level of the semiconductor chip core to generate an intermediate signal B that has an amplitude from ground level to the power supply potential VDH level of the external output interface. Then, the first level converter circuit 21 provides the intermediate signal B to the output circuit 30.

The second level converter 10b includes a second input circuit 12 and a second level converter circuit 22. The second input circuit 12 includes first and second inverter circuits 12a and 12b. The inverter circuits 12a and 12b each have two power supply terminals respectively connected to a power supply potential VDL of the semiconductor chip core and a ground reference potential. The first inverter circuit 12a receives a control input signal C and logically inverts the control input signal C to generate a signal CI that has either a ground level (L level) or a power supply potential VDL level (H level) of the semiconductor chip core. The second inverter circuit 12b receives signal CI from the first inverter circuit 12a and logically inverts the signal CI to generate a signal CT having either a power supply potential VDL level of the semiconductor chip core (H level) or a ground level (L level). Therefore, the second input circuit 12 generates complementary signals CT and CI that have amplitudes from ground level to the power supply potential VDL level of the semiconductor chip core.

The second level converter circuit 22 receives the signals CI and CT. The signal CI generated by the first inverter circuit 12a is provided to the gate of an N-channel MOS transistor TN21, and the signal CT generated by the second inverter circuit 12b is provided to the gate of an N-channel MOS transistor TN22. The sources of both transistors TN21 and TN22 are connected to ground.

The drain of the transistor TN21 is connected to the drain of a P-channel MOS transistor TP21, and the drain of the transistor TN22 is connected to the drain of a P-channel MOS transistor TP22. The sources of both P-channel MOS transistors TP21 and TP22 are connected to the external output interface power supply potential VDH.

A node N21 between the transistors TN21 and TP21 is connected to the gate of the transistor TP22, and the node N22 between the transistors TN22 and TP22 is connected to the gate of the transistor TP21. Furthermore, the node N21 is connected to the output circuit 30, and an intermediate signal D that has either a ground level (L level) or an external output interface power supply potential VDH level (H level) is provided from the node N21 to the output circuit 30. That is, the second level converter circuit 22 performs level conversion of the complementary signals CT and CI that have amplitudes from ground level to the power supply potential VDL level of the semiconductor chip core to generate an intermediate signal D that has an amplitude from ground level to the power supply potential VDH level of the external output interface. Then, the second level converter circuit 22 provides the intermediate signal D to the output circuit 30.

The timing adjustment circuit T1 includes a capacitor C1 connected between the gate terminal of the transistor TN11 in the first level converter circuit 21 and the output terminal of the first level converter circuit 21 connected to the output circuit 30. A node N13 is a connection point of the gate terminal of the transistor TN11 and the timing adjustment circuit T1, and a node N14 is a connection point of the output terminal of the first level converter circuit 21 and the timing adjustment circuit T1. The timing adjustment circuit T1 functions to suppress the generation of a signal delay skew of the intermediate signal B generated by the first level converter 10a relative to the intermediate signal D, which is generated by the second level converter 10b, during power activation.

The output circuit 30 includes a logic control circuit 40 and a final stage buffer 50. The logic control circuit 40 includes five inverter circuits 41, 42, 43, 44, and 45. A NOR circuit 46 and a NAND circuit 47 are connected to the inverter circuits 41 through 45. The inverter circuits 41 through 45 each have two power supply terminals (not shown) respectively connected to a ground reference level and an external output interface power supply potential VDH.

The inverter circuit 41 receives the intermediate signal B from the first level converter 10a and logically inverts the intermediate signal B to generate a logically inverted signal BI that is provided to the input terminal of the NOR circuit 46 and the input terminal of the NAND circuit 47. The inverter circuit 42 receives the intermediate signal D from the second level converter 10b and logically inverts the intermediate signal D to generate a logically inverted signal DI that is provided to the inverter circuit 43 and the input terminal of the NAND circuit 47. The inverter circuit 43 receives the signal DI from the inverter circuit 42 and logically inverts the signal DI to generate a signal DT having a signal level equal to the intermediate signal D. The signal DT is then provided to the input terminal of the NOR circuit 46.

The NOR circuit 46 generates a signal E based on the signal BI and signal DT provided to its input terminals and provides the signal E to the inverter circuit 44. The inverter circuit 44 receives the signal E from the NOR circuit 46 and logically inverts the signal E to generate an inversion signal E bar, which is then provided to the final stage buffer 50.

The NAND circuit 47 generates a signal F based on the signals BI and DI received by its input terminals and provides the signal F to the inverter circuit 45. The inverter circuit 45 receives the signal F from the NAND circuit 47 and logically inverts the signal F to generate an inversion signal F bar that is then provided to the final stage buffer 50.

The final stage buffer 50 includes a P-channel MOS transistor TP50 and an N-channel MOS transistor TN50. The inversion signal E bar generated by the inverter circuit 44 is provided to the gate of the P-channel MOS transistor TP50, and the inversion signal F bar generated by the inverter circuit 45 is provided to the gate of the N-channel MOS transistor TN50. The transistor TP50 has a sources connected to the external output interface power supply potential VDH and a drain connected to the drain of the transistor TN50. The source of the transistor TN50 is connected to ground.

A node N50 between the transistors TP50 and TN50 is connected to an external output terminal EX. The output signal OUT is provided from the node N50 to the external output terminal EX.

An operation performed when the voltage level of each power supply of the output buffer circuit 1 is stable will now be discussed with reference to FIG. 2.

First, the operation performed when an L level data input signal A and an L level control input signal C are provided to the level converter unit 10 will be discussed.

When an L level data input signal A is provided to the level converter unit 10, the signal AI is set at an H level and the signal AT is set at an L level. Further, the transistor TN11 is turned ON and the transistor TN12 is turned OFF. When the transistor TN11 is turned ON, the gate of the transistor TP12 is connected to ground and the transistor TP12 is turned ON. When the transistor TP12 is turned ON, the transistor TP11 is turned OFF because the gate of the transistor TP11 is connected to the power supply potential VDH of the external output interface. In this state, the potential at the node N11 between the transistor TN11 and the transistor TP11 is set to the ground level, and an intermediate signal B having the ground level (L level) is provided from the node N11 to the inverter circuit 41.

When an L level control input signal C is provided to the level converter unit 10, the signal CI is set at H level and the signal CT is set at an L level, and the transistor TN21 is turned ON and the transistor TN22 is turned OFF. When the transistor TN21 is turned ON, the gate of the transistor TP22 is connected to ground and the transistor TP22 is turned ON. When the transistor TP22 is turned ON, the transistor TP21 is turned OFF because the gate of the transistor TP21 is connected to the power supply potential VDH of the external output interface. In this state, the potential at the node N21 between the transistor TN21 and the transistor TP21 is set at the ground level, and an intermediate signal D having the ground level (L level) is provided from the node N21 to the inverter circuit 42.

When an L level intermediate signal B is provided to the inverter circuit 41 and an L level intermediate signal D is provided to the inverter circuit 42, an H level signal BI and an L level signal DT are provided to the NOR circuit 46, and an H level signal BI and an H level signal DI are provided to the NAND circuit 47. Then, an L level signal E is provided from the NOR circuit 46 to the inverter circuit 44, and an H level signal E bar is provided from the inverter circuit 44 to the P-channel MOS transistor TP50. Furthermore, an L level signal F is provided from the NAND circuit 47 to the inverter circuit 45, and an H level signal F bar is provided from the inverter circuit 45 to the N-channel MOS transistor TN50.

Then, the P-channel MOS transistor TP50 is turned OFF in response to the H level signal E bar, and the N-channel MOS transistor TN50 is turned ON in response to the H level signal F bar. Thus, the potential of the node N50 between the transistors TP50 and TN50 is set at ground level (L level), and an L level output signal OUT is provided from the node N50 to the external output terminal EX.

Next, when the data input signal A rises from the L level to the H level at time t1, the signal AI falls to the L level and the signal AT rises to the H level. Thus, the transistor TN11 is turned OFF and the transistor TN12 is turned ON. Then, the transistor TP11 is turned ON and the transistor TP12 is turned OFF. In this state, the potential at the node N11 rises to the power supply potential VDH level (H level) of the external output interface, and an H level intermediate signal B is provided from the node N11 to the inverter circuit 41. At the moment the signal AI falls from the H level to the L level (time t1), the intermediate signal B also has the L level and the capacitor C1 is not discharged since there is no potential difference between the potentials at the nodes N13 and N14. Moreover, at the moment the intermediate signal B rises from the L level to the H level (time t2), the operation of each transistor in the first level converter circuit 21 has already been determined, and the first level converter circuit 21 is stably operating. Thus, the signal levels of the signals B and D input to and output from the first level converter circuit 21 are subtly affected by the capacitor C1.

Then, when an H level intermediate signal B and an L level intermediate signal D are provided to the output circuit 30, an L level signal E bar is provided from the NOR circuit 46 to the gate of the P-channel MOS transistor TP50 via the inverter circuit 44, and an L level signal F bar is provided from the NAND circuit 47 to the gate of the N-channel MOS transistor TN50 via the inverter circuit 45. The P-channel MOS transistor TP50 is turned ON and the N-channel MOS transistor TN50 is turned OFF in response to the L level signals E bar and F bar, respectively. Thus, the potential at the node N50 is set at the power supply potential VDH level (H level) of the external output interface, and an H level output signal OUT is provided from the node N50 to the external output terminal EX.

Subsequently, when the control input signal C rises from the L level to the H level at time t3, the signal CI falls to the L level and the signal CT rises to the H level. Thus, the transistor TN21 is turned OFF and the transistor TN22 is turned ON. Then, the transistor TP21 is turned ON and the transistor TP22 is turned OFF. In this state, the potential at the node N21 rises to the power supply potential VDH level (H level) of the external output interface, and an H level intermediate signal D is provided from the node N21 to the inverter circuit 41.

When an H level intermediate signal B and an H level intermediate signal D are provided to the output circuit 30, an H level signal E bar is provided from the NOR circuit 46 to the gate of the P-channel MOS transistor TP50 via the inverter circuit 44, and an L level signal F bar is provided from the NAND circuit 47 to the gate of the N-channel MOS transistor TN50 via the inverter circuit 45. The P-channel MOS transistor TP50 and the N-channel MOS transistor TN50 are both turned OFF in response to the H level signal E bar and the L level signal F bar, respectively. Thus, the node N50 is set at high impedance.

Next, when the data input signal A falls from an H level to an L level at time t4, the signal AI rises to the H level and the signal AT falls to the L level. Thus, the transistor TN11 is turned ON and the transistor TN12 is turned OFF. Then, the transistor TP12 is turned ON and the transistor TP11 is turned OFF. In this state, the potential at the node N11 falls to ground level (L level), and an L level intermediate signal B is provided from the node N11 to the inverter circuit 41. As previously mentioned, the moment the intermediate signal B falls from the H level to the L level (time t5), the operation of each transistor in the first level converter circuit 21 has already been determined, and the first level converter circuit 21 is stably operating. Thus, the signal level of the intermediate signal B generated by the first level converter circuit 21 are not affected by the capacitor C1.

When an L level intermediate signal B and an H level intermediate signal D are provided to the output circuit 30, an H level signal E bar is provided from the NOR circuit 46 to the gate of the P-channel MOS transistor TP50 via the inverter circuit 44, and an L level F bar signal is provided from the NAND circuit 47 to the gate of the N-channel MOS transistor TN50 via the inverter circuit 45. The P-channel MOS transistor TP50 and the N-channel MOS transistor TN50 are both turned OFF in response to the H level signal E bar and the L level signal F bar, respectively. Thus, the node N50 is set at high impedance.

The operation of the output buffer 1 during power activation will now be discussed with reference to FIG. 5. The following describes the operation when an L level data input signal A and an L level control input signal C are respectively provided to the first and second level converters 10a and 10b.

Figure 5A:
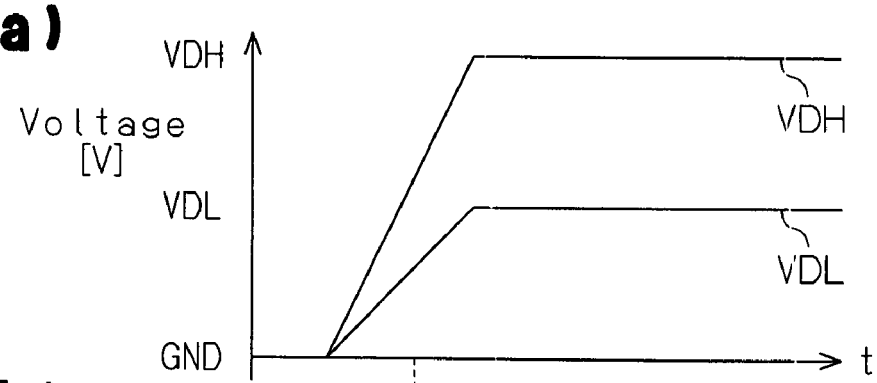
FIGS. 5(a) through 5(e) are waveform diagrams showing operation during power activation in the first embodiment.

As shown in FIG. 5(a), during power activation, the power supply potential VDL of the semiconductor chip core and the power supply potential VDH of the external output interface respectively rise at a predetermined slope. The power supply potential VDL of the semiconductor chip core rises with a more moderate slope than the power supply potential VDH of the external output interface.

In this state, when the L level data input signal A is provided to the first input circuit 11, a signal AI having the power supply potential VDL level of the semiconductor chip core is provided to the transistor TN11 of the first level converter circuit 21, and a ground level signal AT is provided to the transistor TN12. Furthermore, when an L level control input signal C is provided to the second input circuit 12, a signal CI having a power supply potential VDL level of the semiconductor chip core is provided to the transistor TN21 of the second level converter circuit 22, and an L level signal CT is provided to the transistor TN22.

Figure 5B:
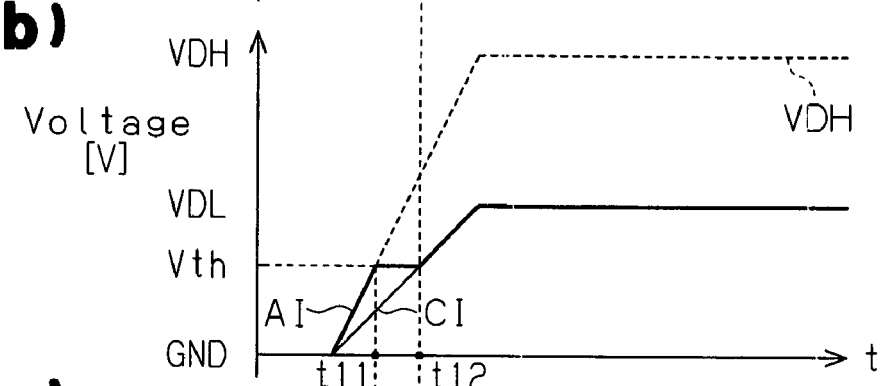
Figure 5C:
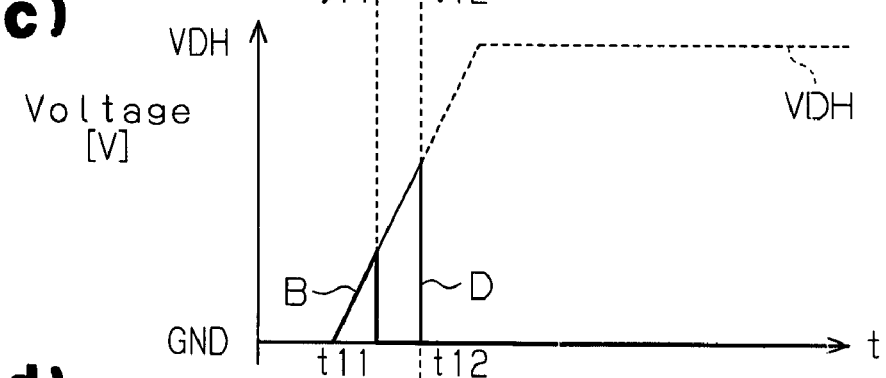

The transistors TN12 and TN22 are turned OFF by the L level signals AT and CT. The transistors TN11 and TN21 are turned ON when a stable power supply potential VDL of the semiconductor chip core is provided to the gates of the transistors TN11 and TN21 as described above. The transistors TN11 and TN21 are not turned ON until the potentials at the signals AI and CI exceed the threshold voltages Vth of the respective transistors TN11 and TN21 during power activation. Therefore, the first and second level converter circuits 21 and 22 have unstable operation in inactive regions until the signal levels of the signals AI and CI rise and the transistors TN11 and TN21 are turned ON. That is, in the inactive region, the first and second level converter circuits 21 and 22 generate intermediate signals B and D that rise following the rising level of the power supply potential VDH of the external output interface as shown in FIG. 5(c) regardless of the provided L level signals A and C. Then, when the signals AI and CI exceed the threshold voltages Vth of the transistors TN11 and TN21, the converter circuits 21 and 22 are operated and the intermediate signals B and D following the rising level of the power supply potential VDH of the external output interface fall to the ground level.

However, when the parasitic capacitance of the first level converter 10a becomes greater than the parasitic capacitance of the second level converter 10b, the transmission time of the intermediate signal B is lengthened and the intermediate signal B falls later than the intermediate signal D. Since the period in which the signals E bar and F bar are both set at the L level is generated by this signal delay, a problem arises in that an erroneous operation signal SH is generated with an H level following the rising level of the power supply potential VDH of the external output interface.

To cope with this problem, the output buffer circuit 1 of the present embodiment includes the timing adjustment circuit T1, which is located between the node N13 (input side) and node N14 (output side) of the first level converter circuit 21 so as to suppress the occurrence of the signal delay skew of the intermediate signal B relative to the intermediate signal D. With the timing adjustment circuit T1, the potential at the node N14 (intermediate signal B) is reflects the potential at the node N13 (signal AI) in an inactive region.

Specifically, in an inactive region, the signal level of the signal AI follows the rising level of the power supply potential VDL of the semiconductor chip core. Since the power supply potential VDL of the semiconductor chip core rises with a more moderate slope than the power supply potential VDH of the external output interface (intermediate signal B in the inactive region), the potential difference between the node N13 and node N14 constantly fluctuates. Therefore, the change of the potential of the node N14 may be rapidly reflected at the node N13 through the capacitor C1 of the timing adjustment circuit T1. That is, as shown in FIG. 5(b), the potential at node N13, that is, the signal level of the signal AI, increases following the rising level of the power supply potential VDH of the external output interface.

Thus, the signal level of the signal AI rises more rapidly than the signal level of the signal CI that follows the rising level of the power supply potential VDL of the semiconductor chip core. Therefore, the signal AI reaches the threshold voltage Vth of the transistor TN11 at time t11 more rapidly than the signal CI, and the transistor TN11 is turned ON. Therefore, the intermediate signal B having a ground level (L level) is provided from the node N11 between the transistors TP11 and TN11 to the node N14. That is, at time t11, the intermediate signal B falls from the rising level of the power supply potential VDH of the external output interface to the ground level, as shown in FIG. 5(c).

Subsequently, the signal CI reaches the threshold voltage Vth of the transistor TN21 at time t12, as shown n FIG. 5(b). Thus, the intermediate signal B falls more rapidly than the intermediate signal D for an amount corresponding to time (t12-t11). Therefore, the occurrence of a signal delay skew of the intermediate signal B relative to intermediate signal D is suppressed even when the parasitic capacitance of the first level converter 10a is greater than that of the second level converter 10b and the transmission time of the intermediate signal B is lengthened.

Figure 5D:
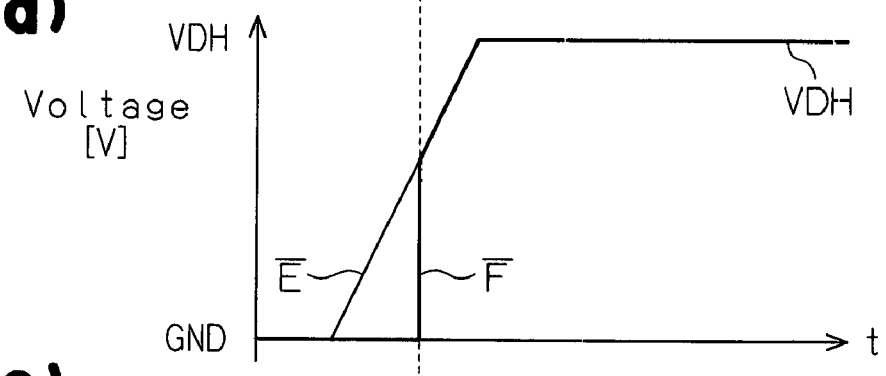
Figure 5E:

In this manner, the signal E bar generated by the inverter circuit 44 does not fall to the L level, as shown in FIG. 5(d), since at no time is the intermediate signal B set at the H level and the intermediate signal D set at the L level during power activation. That is, there is no period during which the signals E bar and F bar are both set at L level as in the output buffer circuit 100 of the related art. Therefore, an erroneous operation signal SH is not generated as an output signal OUT in the output buffer circuit 1 of the present embodiment that includes the timing adjustment circuit T1, as shown in FIG. 5(*e*).

The output buffer circuit 1 of the present embodiment has the advantages described below.

(1) A timing adjustment circuit T1 that includes a capacitor C1 is provided between the input side (node N13) and the output side (node N14) of the first level converter circuit 21. Since a change in the potential of the intermediate signal B is reflected in the potential of the signal AI during power activation via the timing adjustment circuit T1, the transistor TN11 of the first level converter circuit 21 is turned ON in accordance with the rising level of the power supply potential VDH of the external output interface. Therefore, the transistor TN11 is turned ON more rapidly than the transistor TN21 that is turned ON in accordance with the rising level of the power supply potential VDL of the semiconductor chip core. Thus, the occurrence of a signal delay skew of the intermediate signal B relative to the intermediate signal D is suppressed. Accordingly, generation of an erroneous operation signal SH is optimally suppressed since there is no period during which both signals E bar and F bar are set at the L level during power activation.

Furthermore, since the occurrence of a signal delay skew of the intermediate signal B is suppressed in this manner, there is improved degree of freedom in the rise sequence of the power supply potential VDL of the semiconductor chip core and the power supply potential VDH of the external output interface.

(2) The timing adjustment circuit T1 only includes the capacitor C1. Since the timing adjustment circuit T1 has a simple structure, the addition of the timing adjustment circuit T1 does not greatly increase the size of the output buffer circuit 1.

Second Embodiment

An output buffer circuit 2 of a second embodiment according to the present invention will now be discussed with reference to FIGS. 6 and 7. The output buffer circuit 2 of the second embodiment includes a timing adjustment circuit T2 that differs from the timing adjustment circuit T1 for the output buffer circuit 1 of the first embodiment. The timing adjustment circuit T2 will now be described in detail. Like or same reference numerals are given to those components that are the same or similar as those in FIGS. 3 through 5. Such components will not be described in detail.

Figure 6:
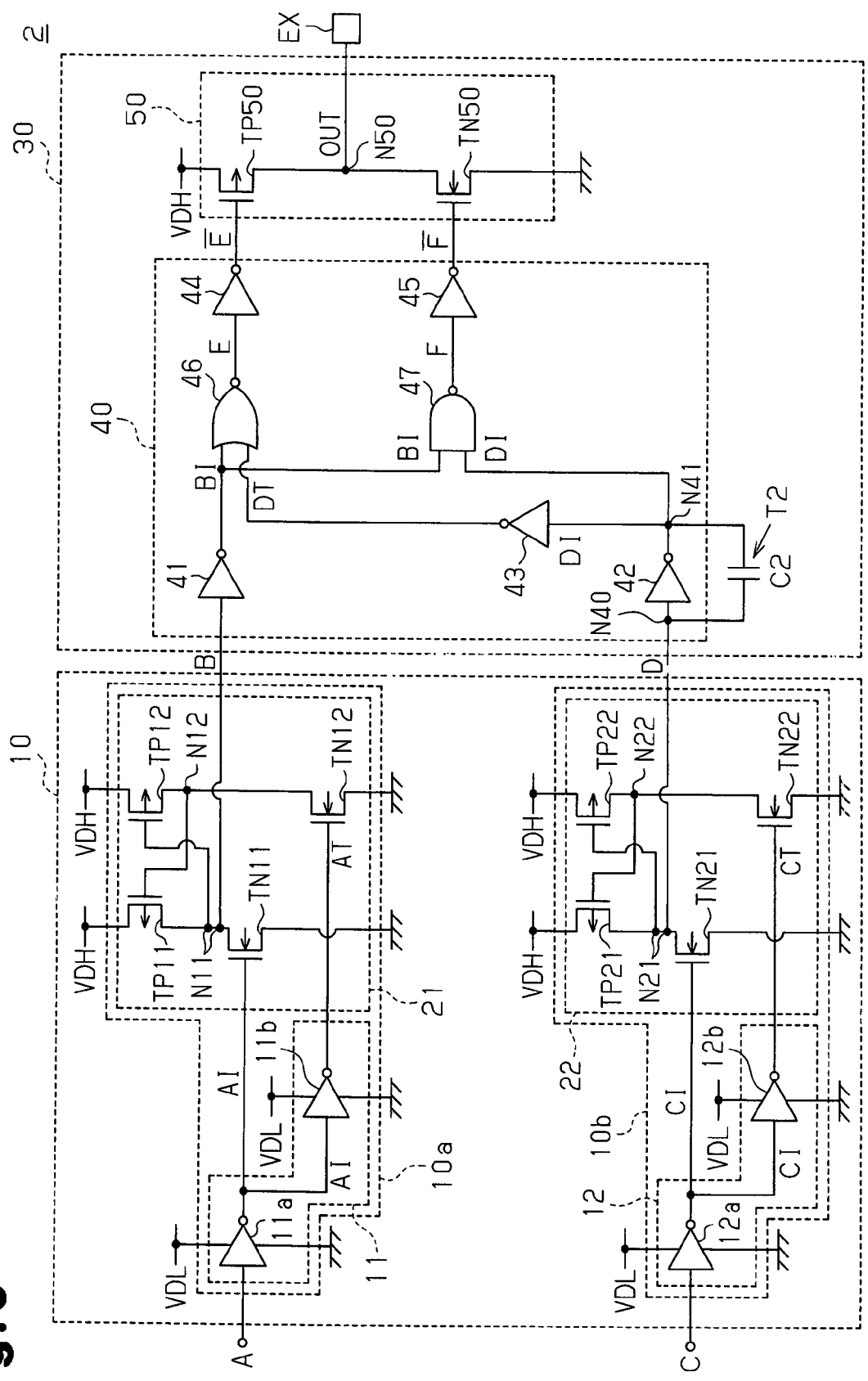
FIG. 6 is a schematic circuit diagram showing an output buffer circuit according to a second embodiment.

As shown in FIG. 6, the timing adjustment circuit T2 includes a capacitor C2 connected in parallel to the inverter circuit 42 that is connected to the node N21 of the second level converter circuit 22. That is, the capacitor C2 is connected between the input terminal and output terminal of the inverter circuit 42. A node N40 is a connection point of the capacitor C2 and the input terminal of the inverter circuit 42. A node N41 is a connection point of the capacitor C2 and the output terminal of the inverter circuit 42. The timing adjustment circuit T2 functions to suppress the generation of a signal delay skew of the intermediate signal B relative to the intermediate signal D by delaying the intermediate signal D provided from the second level converter 10*b* during power activation.

The operation of the output buffer circuit 2 of the second embodiment during power activation will now be described with reference to FIG. 7.

Figure 7A:
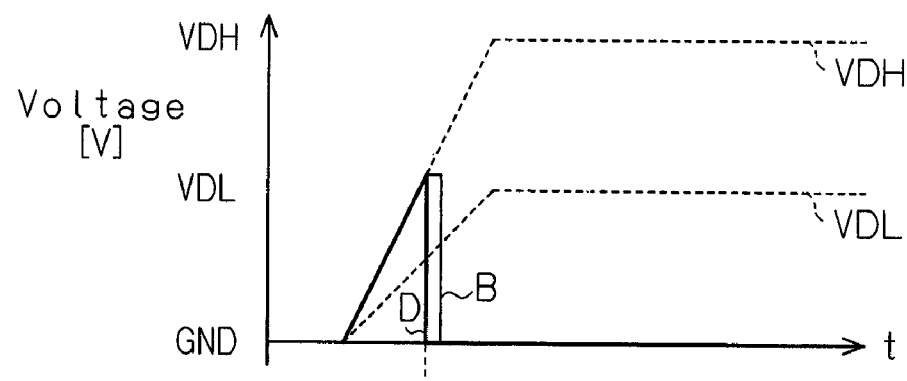
FIGS. 7(a) through 7(c) are waveform diagrams showing operations during power activation in the second embodiment.
Figure 7B:
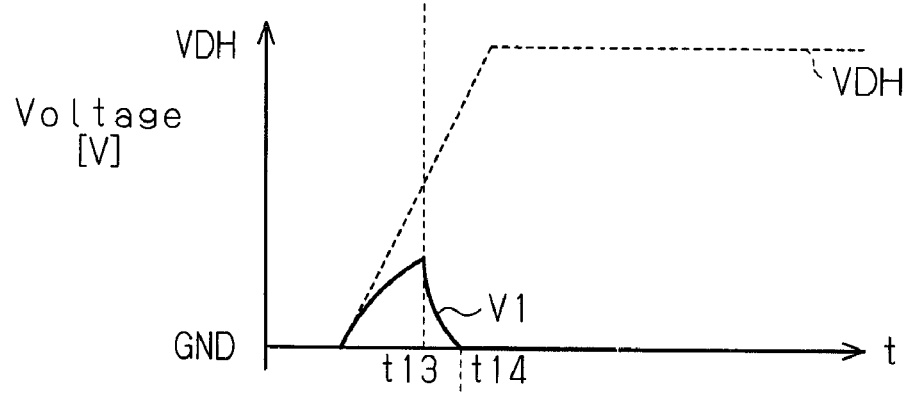
Figure 7C:
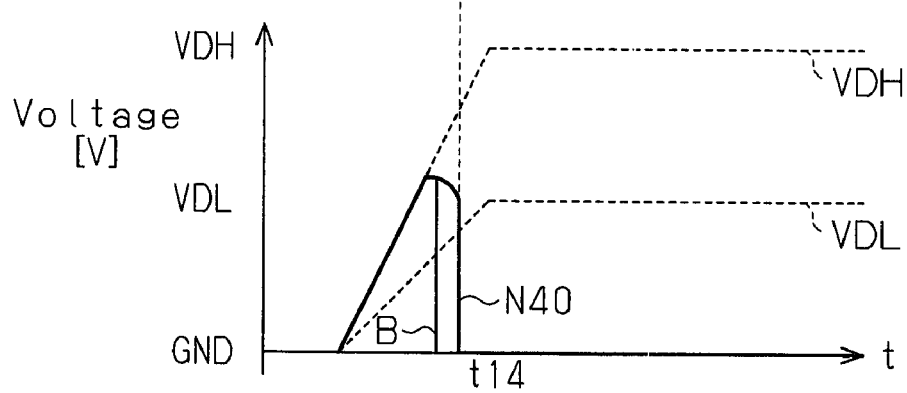

As shown in FIG. 7(*a*), during power activation, the power supply potential VDL of the semiconductor chip core and the power supply potential VDH of the external output interface respectively rise with a predetermined slope. The power supply potential VDL of the semiconductor chip core rises with a more moderate slope than the power supply potential VDH of the external output interface.

When an L level data input signal A and L level control input signal C are respectively provided to the first input circuit 11 and second input circuit 12, signals AI and CI that follow and rise with the level of the power supply potential VDL of the semiconductor chip core are respectively provided to the gates of the transistors TN11 and TN21. The signal levels of the intermediate signals B and D follow and rise with the rising level of the power supply potential VDH of the external output interface until exceeding the threshold voltages Vth of the transistors TN11 and TN21, as shown in FIG. 7(*a*). When the signals AI and CI exceed the threshold voltages Vth of the transistors TN11 and TN21, the level converter circuits 21 and 22 are operated, and the intermediate signals B and D fall to the ground level.

When the signal level of the intermediate signal D follows and rises with the rising level of the external output interface power supply potential VDH, charge accumulates in the capacitor C2 that is connected in parallel to the inverter circuit 42 due to the difference in potential between the node N40 and node N41. This increases the voltage V1 across the capacitor C2, as shown in FIG. 7(*b*). When the signal CI reaches the threshold voltage Vth of the transistor TN21 at time t13 and the intermediate signal D falls to the ground level, the voltage V1 across the charged capacitor C2 causes a delay in the fall of the potential at the node N40, as shown in FIG. 7(*c*). That is, the potential at the node N40 falls to the ground level at time T14 when the discharging of the voltage V1 across the capacitor C2 ends.

With the timing adjustment circuit T2, the fall of the intermediate signal D is delayed by the discharging time (the time from time t13 to time t14) of the voltage across the capacitor C2 even when the parasitic capacitance of the first level converter 10*a* is greater than that of the second level converter 10*b* and the transmission time of the intermediate signal B is lengthened as shown in FIG. 7(*a*). Therefore, the intermediate signal B falls to the ground level more rapidly than the intermediate signal D.

In this way, as shown in FIG. 7(*c*), the signal E bar generated by the inverter circuit 44 does not fall to the L level since there is no period during which the intermediate signal B is set at the H level and the intermediate signal D (potential of the node N40) is set at the L level during power activation. That is, there is no period during which the signals E bar and F bar are both set at L levels as in the output buffer circuit 100 of the related art. Therefore, in the output buffer circuit 2 of the second embodiment including the timing adjustment circuit T2, there is no generation of an erroneous operation signal SH as the output signal OUT.

The output buffer circuit 2 of the second embodiment has the advantages described below.

(1) The timing adjustment circuit T2 that includes the capacitor C2 is connected in parallel to the inverter circuit 42, which is connected to the node N21 of the second level converter circuit 22. With the timing adjustment circuit T2, the fall of the intermediate signal D is delayed during power activation for a period corresponding to the discharging time of the voltage V1 across the capacitor C2. Therefore, the intermediate signal B falls to the ground level more rapidly than the intermediate signal D even when the transmission time of the intermediate signal D is lengthened due to the internal parasitic capacitance of the level converters 10a and 10b. In this way, there is no generation of an erroneous operation signal SH since there is no period during which the signals E bar and F bar are both set at L levels during power activation. Moreover, the delay time of the intermediate signal D can be easily changed by changing the capacitance of the capacitor C2.

(2) The timing adjustment circuit T2 only includes the capacitor C2. Since the timing adjustment circuit T2 has a simple structure, the addition of the timing adjustment circuit T2 does not greatly increase the size of the output buffer circuit 2.

Third Embodiment

An output buffer circuit 3 according to a third embodiment of the present invention will now be described below with reference to FIG. 8. The output buffer circuit 3 of the third embodiment includes a timing adjustment circuit T3 that differs from the timing adjustment circuits T1 and T2 of the output buffer circuits 1 and 2 of the first and second embodiments. The timing adjustment circuit T3 is described in detail below. Like or same reference numerals are given to those components that are the same or similar as those in FIGS. 3 through 7. Such components will not be described in detail.

Figure 8:
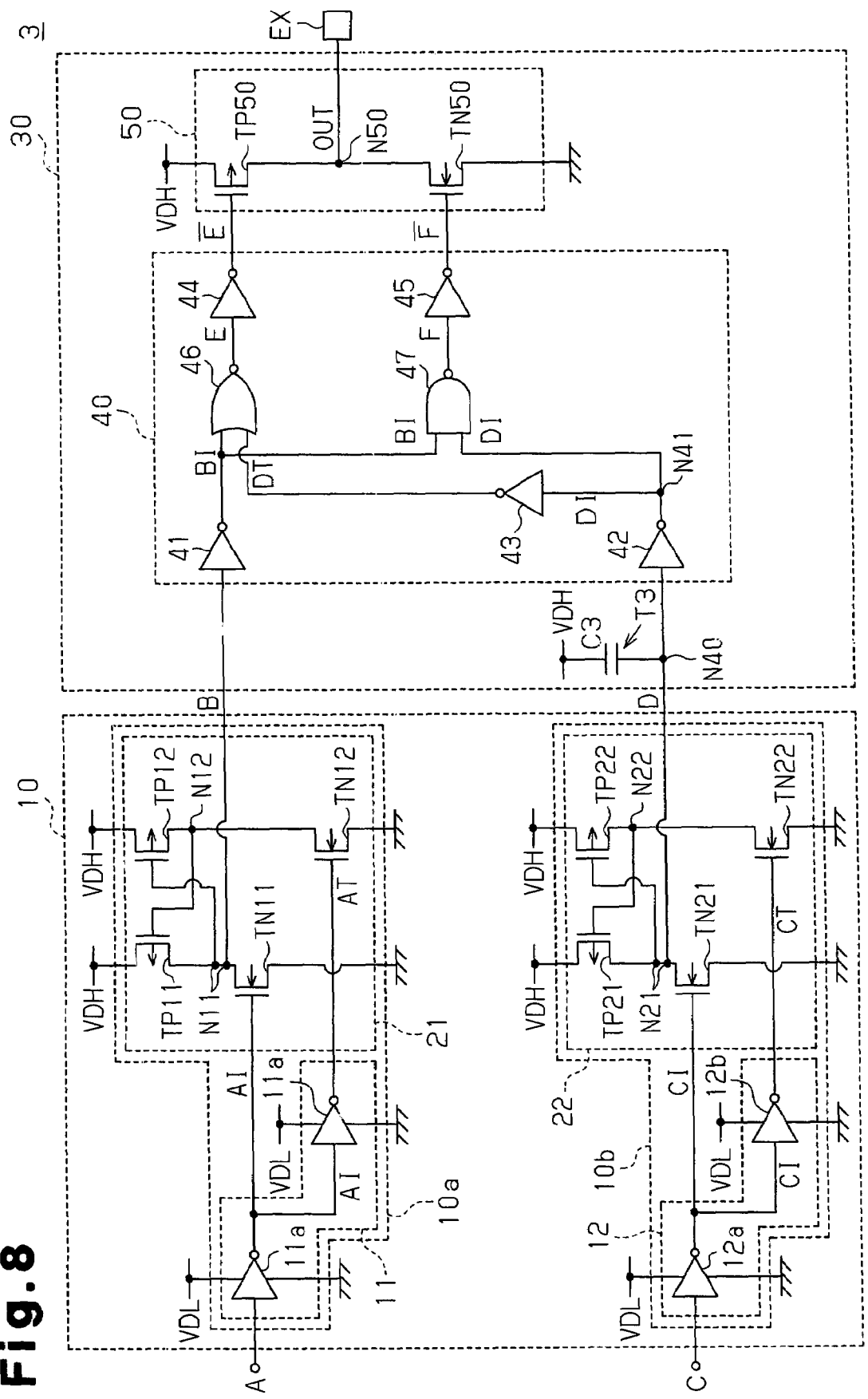
FIG. 8 is a schematic circuit diagram showing an output buffer circuit according to a third embodiment.

As shown in FIG. 8, the timing adjustment circuit T3 includes a capacitor C3 connected between the input terminal (node N40) of the inverter circuit 42 and the power supply potential VDH of the external output interface.

In the output buffer circuit 3, the capacitor C3 delays the timing of the fall of the intermediate signal D to the L level when the signal CI reaches the threshold voltage Vth of the transistor TN21 during power activation. Thus, a signal delay skew of the intermediate signal B relative to the intermediate signal D is optimally suppressed. As a result, there is no generation of an erroneous operation signal SH as an output signal OUT.

The output buffer circuit 3 of the third embodiment has the advantages described below.

(1) The capacitor C3 is arranged between the input terminal (node N40) of the inverter circuit 42 and the power supply potential VDH of the external output interface. The capacitor C3 delays the fall of the intermediate signal D during power activation. Therefore, the generation of a delay signal skew of the intermediate signal B relative to the intermediate signal D is optimally suppressed. As a result, there is no generation of an erroneous operation signal SH as an output signal OUT.

(2) The timing adjustment circuit T3 only includes the capacitor C3. Since the timing adjustment circuit T3 has a simple structure, the addition of the timing adjustment circuit T3 does not greatly increase the size of the output buffer circuit 3.

Fourth Embodiment

An output buffer circuit 4 according to a fourth embodiment of the present invention will now be described below with reference to FIG. 9. The output buffer circuit 4 of the fourth embodiment includes a timing adjustment circuit T4 that differs from the timing adjustment circuits T1, T2, and T3 of the output buffer circuits 1 to 3 of the first through third embodiments. The timing adjustment circuit T4 is described in detail below. Like or same reference numerals are given to those components that are the same or similar to those in FIGS. 3 through 8. Such components will not be described in detail.

Figure 9:
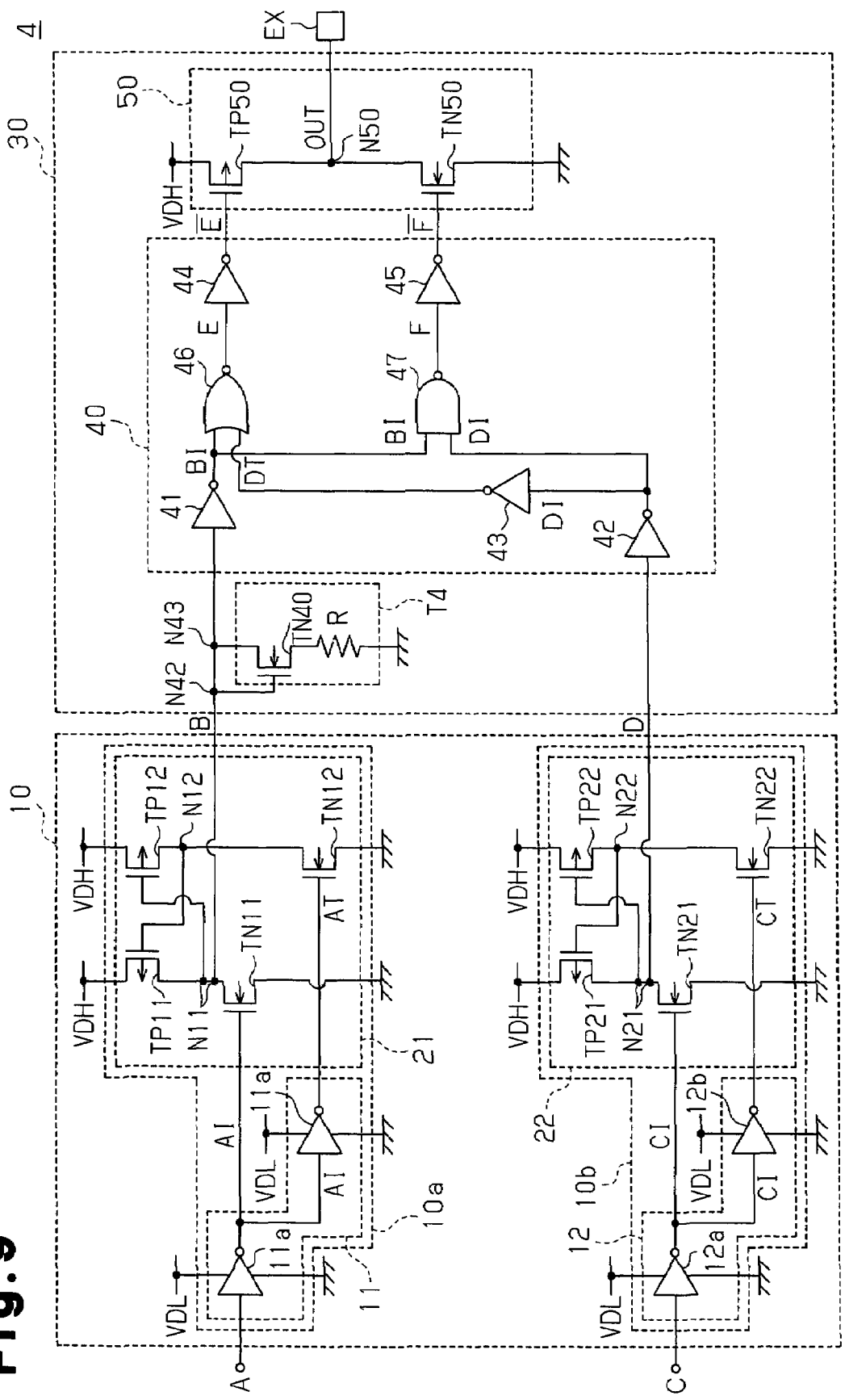
FIG. 9 is a schematic circuit diagram showing an output buffer circuit according to a fourth embodiment.

As shown in FIG. 9, the timing adjustment circuit T4 includes an N-channel MOS transistor TN40 having a drain and gate connected to the input terminal of the inverter circuit 41, which is connected to the node N11 of the first level converter circuit 21, and a high-resistance element R, which is connected between the ground and the source of the transistor TN40. The high-resistance element R has a resistance value that is significantly greater than the ON resistance when the transistor TP11 is turned ON. A node N42 is a connection point of the input terminal of the inverter circuit 41 and the gate of the transistor TN40, and a node N43 is a connection point of the input terminal of the inverter circuit 41 and the drain of the transistor TN40. Furthermore, node N11, node N42, and node N43 are the same node. The timing adjustment circuit T4 functions to suppress the generation of a signal delay skew of the intermediate signal B relative to the intermediate signal D by forcing the intermediate signal B (indefinite operation signal that follows the rising level of the power supply potential VDH of the external output interface) generated by the first level converter 10a to fall to the ground level during power activation.

The operation of the output buffer circuit 4 during power activation will now be described.

In the same manner as in the second and third embodiments, the power supply potential VDL of the semiconductor chip core and the power supply potential VDH of the external output interface respectively rise with a predetermined slope during power activation, and the signal levels of the intermediate signals B and D follow and rise with the rising level of the external output interface power supply potential VDH until the signals AI and CI exceed the threshold voltage Vth of the transistors TN11 and TN21.

When the intermediate signal B follows and rises with the rising level of the external output interface power supply potential VDH, and the potential exceeds the threshold voltage of the transistor TN40 in the timing adjustment circuit T4, the transistor TN40 is turned ON and the potential of the node N43 forcibly falls to the ground level due to the high-resistance element R. When the potential at the node N43 is forced to the ground level, the transistor TP12 is turned ON because the gate of the transistor TP12 is connected to ground. When the transistor TP12 is turned ON, the transistor TP11 is turned OFF because the gate of the transistor TP11 is connected to the power supply potential VDH of the external output interface. Thus, the first level converter circuit 21 operates stably. Accordingly, the intermediate signal B is maintained at an L level (ground level).

Since the intermediate signal B is forced to ground level by the timing adjustment circuit T4 when the potential of the intermediate signal B has reached the threshold voltage of the transistor TN40, the intermediate signal B falls more rapidly than the intermediate signal D in the same manner as the output buffer circuits 1 to 3 of the first to third embodiments. Therefore, the generation of a delay signal skew of the intermediate signal B relative to the intermediate signal D is suppressed. As a result, there is no generation of an erroneous operation signal SH as the output signal OUT.

Furthermore, when the timing adjustment circuit T4 generates an H level intermediate signal B in the nodes N42 and N43 after the power supply voltage level stabilizes, the transistor TN40 is turned ON by the H level intermediate signal B. However, the nodes N42 and N43 maintain the H level potential via the high-resistance element R because the resistance value of the high-resistance element R is sufficiently higher than the ON resistance of the transistor TP11. Moreover, when the resistance value of the high-resistance element R is low, the direct current momentarily flows toward the ground through the high-resistance element R. However, the direct current flow is suppressed by increasing the resistance value of the high-resistance element R. Thus, an increase in power consumption is optimally suppressed by the addition of the timing adjustment circuit T4.

The output buffer circuit 4 of the fourth embodiment has the advantages described below.

(1) The timing adjustment circuit T4, which includes the N-channel MOS transistor TN40 and high-resistance element R, is arranged between ground and the input terminal of the inverter circuit 41. The intermediate signal B forcibly falls to ground level due to the timing adjustment circuit T4 when the intermediate signal B, which follows and rises with the rising level of the external output interface power supply potential VDH, exceeds the threshold voltage of the transistor TN40. Therefore, since the intermediate signal B falls more rapidly, the occurrence of a signal delay skew of the intermediate signal B is suppressed relative to the intermediate signal D. This optimally suppresses the generation of an erroneous operation signal SH as an output signal OUT.

(2) A high-resistance element R is provided between ground and the gate of the N-channel MOS transistor TN40. In this configuration, when an H level intermediate signal B is generated between the nodes N42 and N43 after the power level stabilizes, the possibility of a direct current flowing toward the ground through the high-resistance element R is optimally suppressed. Thus, an increase in power consumption is optimally suppressed by the addition of the timing adjustment circuit T4.

It should be apparent to those skilled in the art that the present invention may be embodied in many other specific forms without departing from the spirit or scope of the invention. Particularly, it should be understood that the invention may be embodied in the following forms.

Figure 10:
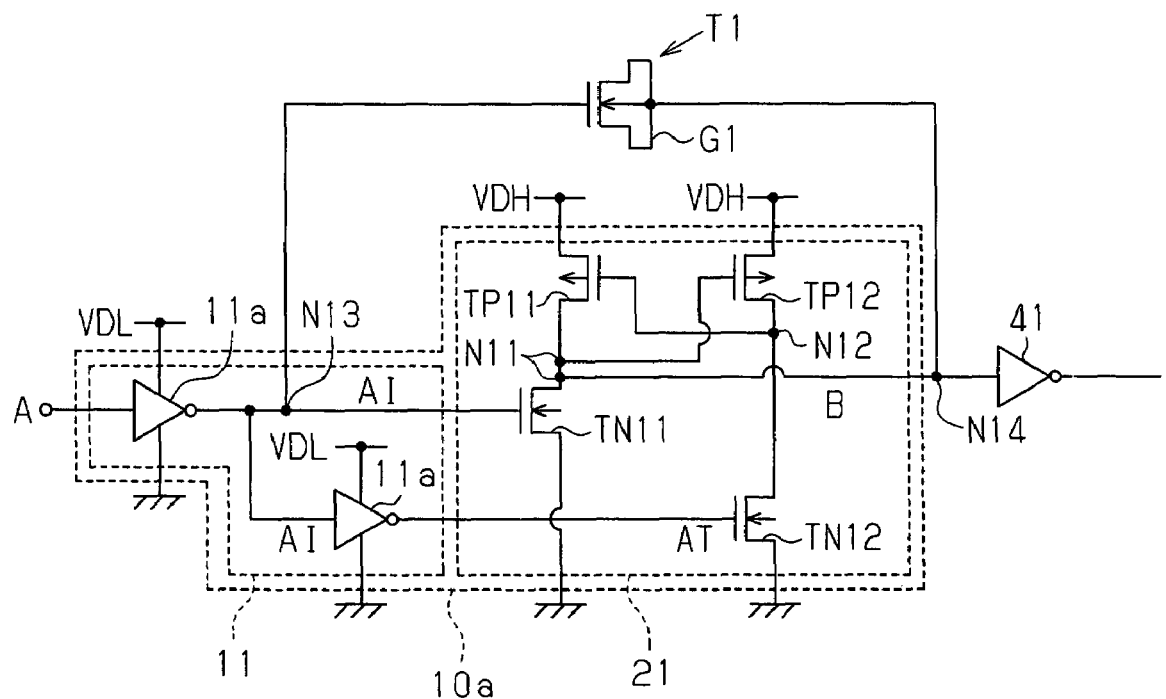
FIG. 10 is a schematic circuit diagram showing a different example of a timing regulating circuit.

The timing adjustment circuit T1 of the first embodiment is realized by the capacitor C1. However, the timing adjustment circuit T1 is not limited to a capacitor as long as it is a capacitive element. For example, the timing adjustment circuit T1 may also be realized by a gate capacitor G1 configured by a transistor element, as shown in FIG. 10. This configuration also obtains the same advantages as the output buffer circuit 1 of the first embodiment.

Figure 11:
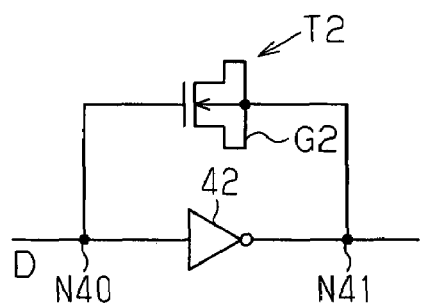
FIG. 11 is a schematic circuit diagram showing a further example of a timing regulating circuit.

The timing adjustment circuit T2 of the second embodiment is realized by the capacitor C2. However, the timing adjustment circuit T2 is not limited to a capacitor as long as it is a capacitive element. For example, the timing adjustment circuit T2 may also be realized by a gate capacitor G2 configured by a transistor element, as shown in FIG. 11. This configuration also obtains the same advantages as the output buffer circuit 2 of the second embodiment.

Figure 12:
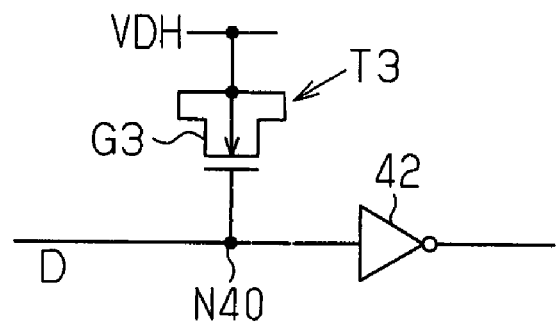
FIG. 12 is a schematic circuit diagram showing another example of a timing regulating circuit.

The timing adjustment circuit T3 of the third embodiment is realized by the capacitor C3. However, the timing adjustment circuit T3 is not limited to a capacitor as long as it is a capacitive element. For example, the timing adjustment circuit T3 may also be realized by a gate capacitor G3 configured by a transistor element, as shown in FIG. 12. This configuration also obtains the same advantages as the output buffer circuit 3 of the third embodiment.

Figure 13:
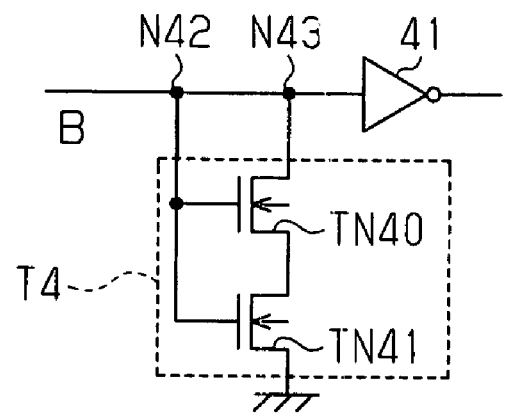
FIG. 13 is a schematic circuit diagram showing still another example of a timing regulating circuit.

As shown in FIG. 13, the high-resistance element R of the timing adjustment circuit T4 of the fourth embodiment may also be changed to an N-channel MOS transistor TN41. An N-channel MOS transistor TN41 is set so as to have an ON resistance value that is significantly higher than the ON resistance value of the transistor TP11 (high ON resistance value). This configuration also obtains the same advantages as the output buffer circuit 4 of the fourth embodiment.

The high-resistance element R may also be eliminated from the timing adjustment circuit T4 of the fourth embodiment.

The timing adjustment circuits T1 to T4 of the above embodiments may be combined in various manners and added to the output buffer circuit. For example, the output buffer circuit may also include the timing adjustment circuit T1 of the first embodiment and the timing adjustment circuit T2 of the second embodiment. Furthermore, the output buffer circuit may also include the timing adjustment circuit T3 of the third embodiment and the timing adjustment circuit T4 of the fourth embodiment. For example, the output buffer circuit may also include the timing adjustment circuit T1 of the first embodiment, the timing adjustment circuit T2 of the second embodiment, and the timing adjustment circuit T4 of the fourth embodiment.

Although the intermediate signal B falls more rapidly than the intermediate signal D in the above embodiments during power activation, the intermediate signal B and the intermediate signal D may also fall simultaneously.

The external output interface power supply potential VDH may also be set at a lower voltage than the power supply potential VDL of the semiconductor chip core in the second to fourth embodiments.

The present examples and embodiments are to be considered as illustrative and not restrictive, and the invention is not to be limited to the details given herein, but may be modified within the scope and equivalence of the appended claims.

What is claimed is:

1. An output buffer circuit comprising:
a first level converter for generating a first signal based on a data input signal having an amplitude range between a first power supply potential and a ground reference potential, wherein the first signal has an amplitude range between a second power supply potential, which differs from the first power supply potential, and the ground reference potential;
a second level converter for generating a second signal having an amplitude range between the second power supply potential and the ground reference potential based on a control input signal having an amplitude range between the first power supply potential and the ground reference potential, wherein the first signal falls with a delay from the second signal;
an output circuit for generating an output signal having one of three values of the ground reference potential, second power supply potential, and high impedance based on the first signal and second signal; and
a timing adjustment circuit for compensating for the fall delay of the first signal from the second signal during power activation and coupled to a first node of the first level converter and a second node of the first level converter,
wherein a level of the first node increases according to the first power supply potential during the power activation and a level of the second node increases according to the second power supply potential during the power activation.

2. The output buffer circuit according to claim 1, wherein the timing adjustment circuit includes a first adjustment circuit that advances the fall of a first signal during power activation.

3. The output buffer circuit according to claim 2, wherein:
the first level converter includes an input transistor having a gate responsive to a signal derived from the data input signal, a drain that receives the second power supply potential, and a source that receives the ground reference potential; and the first adjustment circuit includes a capacitive element connected between the gate of the input transistor and the drain of the input transistor.

4. The output buffer circuit according to claim 3, wherein the capacitive element is a capacitor.

5. The output buffer circuit according to claim 3, wherein the capacitive element is a gate capacitor configured by a transistor element.

* * * * *